US011385627B2

(12) United States Patent
Zheng et al.

(10) Patent No.: US 11,385,627 B2
(45) Date of Patent: Jul. 12, 2022

(54) METHOD AND SYSTEM FOR SCHEDULING SEMICONDUCTOR FABRICATION

(71) Applicant: Yangtze Memory Technologies Co., Ltd., Wuhan (CN)

(72) Inventors: Weirong Zheng, Wuhan (CN); Heqing Wang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 39 days.

(21) Appl. No.: 16/905,194

(22) Filed: Jun. 18, 2020

(65) Prior Publication Data
US 2021/0263505 A1 Aug. 26, 2021

Related U.S. Application Data

(63) Continuation of application No. PCT/CN2020/076111, filed on Feb. 21, 2020.

(51) Int. Cl.
*G05B 19/418* (2006.01)
*G05B 13/02* (2006.01)
(Continued)

(52) U.S. Cl.
CPC ..... *G05B 19/41865* (2013.01); *G05B 13/027* (2013.01); *G06N 3/086* (2013.01);
(Continued)

(58) Field of Classification Search
CPC .. G05B 19/41865; G06F 9/5083; G06F 9/505
See application file for complete search history.

(56) References Cited

U.S. PATENT DOCUMENTS 11,100,437 B2 * 8/2021 Norman ............... G06Q 10/067
2003/0100131 A1 5/2003 Fang et al.
(Continued)

FOREIGN PATENT DOCUMENTS

CN 101361075 A 2/2009
CN 103217960 A 7/2013
(Continued)

OTHER PUBLICATIONS

Wenyou Jia., Research on Scheduling of Batch Processing Machines in Semiconductor Wafer Fabrication System, A Dissertation Submitted to Shanghai Jiao Tong University for the Degree of Philosophy Doctor, May 2016, Shanghai Jiao Tong University, Shanghai, China.

(Continued)

*Primary Examiner* — Thomas C Lee
*Assistant Examiner* — Syed A Warsi
(74) *Attorney, Agent, or Firm* — Anova Law Group, PLLC

(57) ABSTRACT

A semiconductor fabrication scheduling method includes creating a load scheduling data schema including facility data of product lots to be dispatched to a plurality of workstations; generating a load schedule profile using a load-balancing model and based on the load scheduling data schema, wherein the load-balancing model includes one or more objective functions and there is at least one weight factor in an objective function; generating a current load schedule based on the load schedule profile; dispatching the product lots to the plurality of workstations using the current load schedule to complete fabrication of the product lots; obtaining a set of current key performance indicators (KPIs) of the completed fabrication of the product lots; and automatically adjusting the weight factors of the objective functions of the load-balancing model based on the current KPIs (Continued)

using a big-data architecture to generate a next load schedule for next cycle of fabrication.

20 Claims, 6 Drawing Sheets

(51) Int. Cl.
*G06N 3/08* (2006.01)
*H01L 21/67* (2006.01)

(52) U.S. Cl.
CPC .......... *H01L 21/67155* (2013.01); *G05B 2219/32333* (2013.01); *G05B 2219/32335* (2013.01); *G05B 2219/34379* (2013.01)

(56) References Cited

U.S. PATENT DOCUMENTS

| | | | |
|---|---|---|---|
| 2013/0137196 A1 | 5/2013 | Chen et al. | |
| 2018/0330300 A1* | 11/2018 | Runkana | G05B 15/02 |
| 2019/0250594 A1 | 8/2019 | You et al. | |
| 2019/0347593 A1 | 11/2019 | Norman | |

FOREIGN PATENT DOCUMENTS

| | | |
|---|---|---|
| CN | 103310285 A | 9/2013 |
| CN | 103439886 A | 12/2013 |
| CN | 104217978 A | 12/2014 |
| CN | 104423331 A | 3/2015 |
| CN | 104576441 A | 4/2015 |
| CN | 105045243 A | 11/2015 |
| CN | 105182916 A | 12/2015 |
| CN | 105843180 A | 8/2016 |
| CN | 106444649 A | 2/2017 |
| CN | 108171372 A | 6/2018 |
| CN | 108873835 A | 11/2018 |
| CN | 109085803 A | 12/2018 |
| CN | 109146212 A | 1/2019 |
| CN | 109829597 A | 5/2019 |

OTHER PUBLICATIONS

Xiabao Huang et al.. Scheduling Jobs on Batch Processing Machines in Semiconductor Fabrication with Multi-priority Orders, Journal of WUT (Information &. Management Engineering), Apr. 2015, pp. 250-254, vol. 37, No. 2, Wuhan University of Technology, Wuhan, China.

Yen-Fei Lee et al.. Production Scheduling Optimization with Time-Variable Multiple-Objectives for Semiconductor Wafer Fabrication System, Journal of Shanghai Jiaotong University, Feb. 2008, pp. 209-213, vol. 42, No. 2 Shanghai Jiaotong University, Shanghai, China.

Zuntong Wang, Research on Scheduling and Control of Semiconductor Wafer Processing Production Line, Tongji University Post-doctoral Research Report, Jun. 2005, Tongji University, Shanghai, China.

* cited by examiner

METHOD AND SYSTEM FOR SCHEDULING SEMICONDUCTOR FABRICATION

CROSS-REFERENCE TO RELATED APPLICATION

This application is a continuation of International Application No. PCT/CN2020/076111, filed on Feb. 21, 2020, the entire content of which is incorporated herein by reference.

FIELD OF THE TECHNOLOGY

This application relates to the field of semiconductor manufacturing and, specifically, to a semiconductor fabrication scheduling method and system.

BACKGROUND OF THE DISCLOSURE

As semiconductor process technology evolves, the complexity of semiconductor fabrication process continues to increase. A state-of-art integrated circuit (IC) chip often requires hundreds or even thousands process steps performed on a single semiconductor wafer via different and same types of process machines. In order to provide fabrication of product lots from a manufacturing line within an enterprise to meet committed schedules, the lots must be scheduled to dispatch to each tool or piece of manufacturing equipment expeditiously. Further, to avoid having either long waiting or queuing times and having pieces of manufacturing equipment that are "starving" or have no queue, the scheduling must account for both the amount of product to be immediately processed and the capacity, capability, and present queue length of pieces of manufacturing equipment following the current piece of manufacturing equipment.

Thus, the scheduling problem, i.e., how product lots should be released into the fabrication process and dispatched among pieces of manufacturing equipment for processing, is among major fabrication control problems facing the manufacturers.

Current scheduling optimization often uses some algorithms to assign lots to various machines with a combination of automatically generated scheduling schedule and manual adjustment of the schedule based on experience of the manufacturing personnel. Thus, the process of such scheduling optimization is often performed manually, which is tedious and long, and the effect is often undesired.

The disclosed methods and systems are directed to solve one or more problems set forth above and other problems.

SUMMARY

One aspect of the present disclosure includes a semiconductor fabrication scheduling method. The method includes creating a load scheduling data schema including facility data of product lots to be dispatched to a plurality of workstations; and generating a load schedule profile using a load-balancing model and based on the load scheduling data schema. The load-balancing model includes one or more objective functions and there is at least one weight factor in an objective function. The method also includes generating a current load schedule based on the load schedule profile; dispatching the product lots to the plurality of workstations using the current load schedule to complete fabrication of the product lots; obtaining a set of current key performance indicators (KPIs) of the completed fabrication of the product lots; and automatically adjusting the weight factors of the objective functions of the load-balancing model based on the current KPIs using a big-data architecture to generate a next load schedule for next cycle of fabrication.

Another aspect of the present disclosure includes a semiconductor fabrication scheduling system. The system includes a plurality of workstations; a server; and a dispatcher controlled by the server and dispatching product lots to be fabricated to the plurality of workstations. The server is configured to perform: creating a load scheduling data schema including facility data of the product lots; generating a load schedule profile using a load-balancing model and based on the load scheduling data schema, wherein the load-balancing model includes one or more objective functions and there is at least one weight factor in an objective function; generating a current load schedule based on the load schedule profile; controlling the dispatcher to dispatch the product lots to the plurality of workstations using the current load schedule to complete fabrication of the product lots; obtaining a set of current key performance indicators (KPIs) of the completed fabrication of the product lots; and automatically adjusting the weight factors of the objective functions of the load-balancing model based on the current KPIs using a big-data architecture to generate a next load schedule for next cycle of fabrication.

Another aspect of the present disclosure includes a non-transitory computer-readable storage medium. The non-transitory computer-readable storage medium contains computer-executable instructions for, when executed by one or more processors, performing a semiconductor fabrication scheduling method. The method includes creating a load scheduling data schema including facility data of product lots to be dispatched to a plurality of workstations; and generating a load schedule profile using a load-balancing model and based on the load scheduling data schema. The load-balancing model includes one or more objective functions and there is at least one weight factor in an objective function. The method also includes generating a current load schedule based on the load schedule profile; dispatching the product lots to the plurality of workstations using the current load schedule to complete fabrication of the product lots; obtaining a set of current key performance indicators (KPIs) of the completed fabrication of the product lots; and automatically adjusting the weight factors of the objective functions of the load-balancing model based on the current KPIs using a big-data architecture to generate a next load schedule for next cycle of fabrication.

Other aspects of the present disclosure can be understood by those skilled in the art in light of the description, the claims, and the drawings of the present disclosure.

DETAILED DESCRIPTION

The following describes the technical solutions in the embodiments of the present invention with reference to the accompanying drawings. Wherever possible, the same reference numbers will be used throughout the drawings to refer to the same or like parts. Apparently, the described embodiments are merely some but not all the embodiments of the present invention. Features of various described embodiments may be combined, exchanged, added, or removed. Other embodiments obtained by a person skilled in the art based on the embodiments of the present invention without creative efforts shall fall within the protection scope of the present disclosure.

Figure 1:
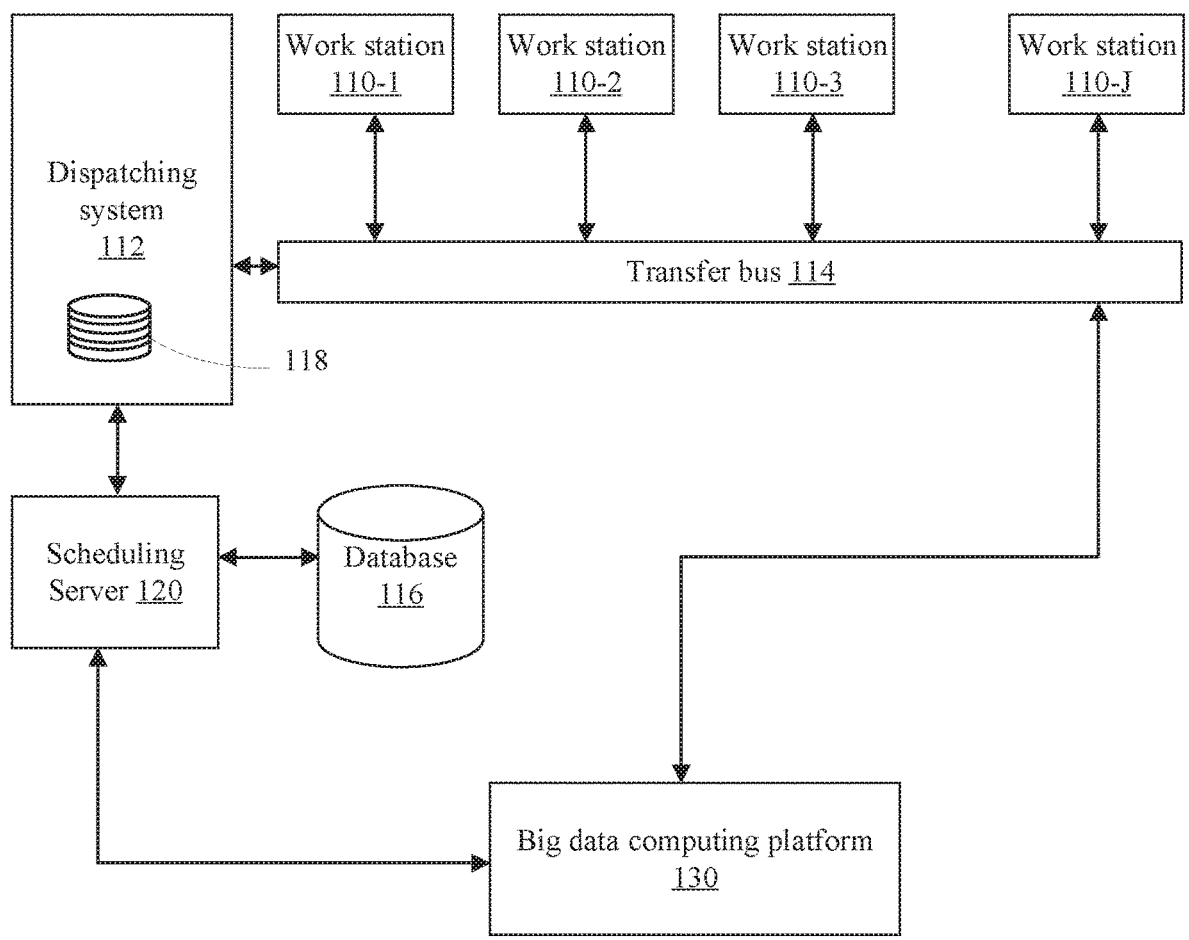
FIG. 1 illustrates an exemplary semiconductor fabrication system consistent with the disclosed embodiments of the present invention.

FIG. 1 illustrates an exemplary semiconductor fabrication system 100 consistent with the disclosed embodiments of the present invention. As shown in FIG. 1, semiconductor fabrication system 100 may include a dispatching system 112, a plurality of work-stations 110-1, 110-2, ..., 110-J, a transfer bus 114, a database 116, a scheduling server 120, and a big-data computing platform 130, where J is a natural number indicating a total number of work-stations. Certain components may be omitted and other components may be added.

Dispatching system 112 may include any appropriate semiconductor wafer dispatching system that dispatches raw or processed wafers 118 (e.g., wafers, wafer lots, or product lots) to the pieces of manufacturing equipment (e.g., workstations). In one embodiment, the dispatching system 112 may be a lot dispatcher. In another embodiment, the dispatching system 112 may be implemented on a computing system controlling a dispatching mechanism.

The plurality workstations 110-1, 110-2, ..., 110-J may represent a total J number pieces of manufacturing equipment, and each equipment may have one or more manufacturing stages. Each manufacturing equipment or workstation, and/or manufacturing stage may perform one or more processes in the fabrication of a wafer in the product. One or more workstations may be considered as a manufacturing line for a specific integrated circuit (IC) fabrication, including front-end-of-lien (FEOL) processing and/or back-end-of-line (BEOL) processing.

The workstations 110-1, 110-2, ..., 110-J may include any appropriate fabrication equipment, with a same type or different types. For example, the workstations may include deposition equipment, such as physical vapor deposition (PVD) workstations, chemical vapor deposition (CVD) workstations, electrochemical deposition (ECD) workstations, molecular beam epitaxy (MBE) workstations, and atomic layer deposition (ALD) workstations. The workstations may also include wet or dry etch processing workstations, and/or chemical-mechanical planarization (CMP) workstations. The workstations may also include optical lithography or UV lithography workstations. Further, the workstations may include doping workstations and/or annealing workstations. Other types of fabrication equipment may also be included.

A transfer bus 114 may be used to transfer product lots among the plurality work stations, the plurality manufacturing stages, and/or among different manufacturing lines. The fabrication or manufacturing process for a particular product lot may start from the dispatching system 112 and follow a corresponding schedule to go through the workstation(s) or manufacturing stages to produce a partial or complete product (e.g., a fabricated wafer). Each workstation may collect and report a status of the product lot's progress or work-in-process (WIP) status describing the advancing of the product lot through the workstation. After the product lot goes through all the workstations, fabrication data such as quality and performance data may also be obtained and reported.

Further, the load of these workstations, and/or stages of a workstation may need to be maximized or optimally scheduled. That is, the workstations, and/or stages of a workstation may be scheduled using a load schedule generated to optimize the fabrication process. The scheduling scheme may consider various objectives for scheduling the fabrication process, including a load balancing scheme. In a narrow sense, the load balancing scheme may refer to efficiently utilize the workstations and/or stages of the workstations, i.e., balancing the load of the workstations. However, in a broad sense, the load balancing scheme ma also refer to balancing other objectives for the workstation scheduling. Thus, in certain embodiments, the term "scheduling" may be used exchangeably with the term "load balancing." The load balancing may include various factors and constraints, and may depends on specific fabrication or applications. For example, those product lots that have a high priority for delivery must be processed expeditiously to meet committed schedules. At the same time, the utilization rate of the workstations and the quality and performance of the fabrication may remain desired.

Accordingly, the scheduling server 120 may control and schedule the load of the dispatching system 112 using a load balancing scheme based on a predetermined algorithm and specific data of the current cycle of fabrication. The scheduling server 120 may include or communicate with a database 116 to obtain various data used in the control and scheduling of the dispatching system 112, such as facility data, product data, process data, etc. Database 116 may a standalone database system or a distributed database system, and may include certain user interfaces for the user to query the database, to enter data, and/or to display data, etc.

The big data computing platform 130 may include one or more computer servers having hardware and software configured to perform data mining, data analysis, and artificial intelligence functions. Specifically, big data computing platform 130 may collect a large amount of fabrication data including the fabrication data of the dispatching system 112 and the various workstations under various load scenarios. The big data computing platform 130 may also obtain data from the database 116.

Further, the scheduling server 120 may communicate with the big data computing platform 130 to obtain historical data, simulated data, and/or real-time data to adjust the load scheduling for the dispatching system 112. Although the big data computing platform 130 and the scheduling server 120 are shown as two separated systems, the big data computing platform 130 and the scheduling server 120 may be integrated into one system or may be distributed in multiple systems.

Figure 2:
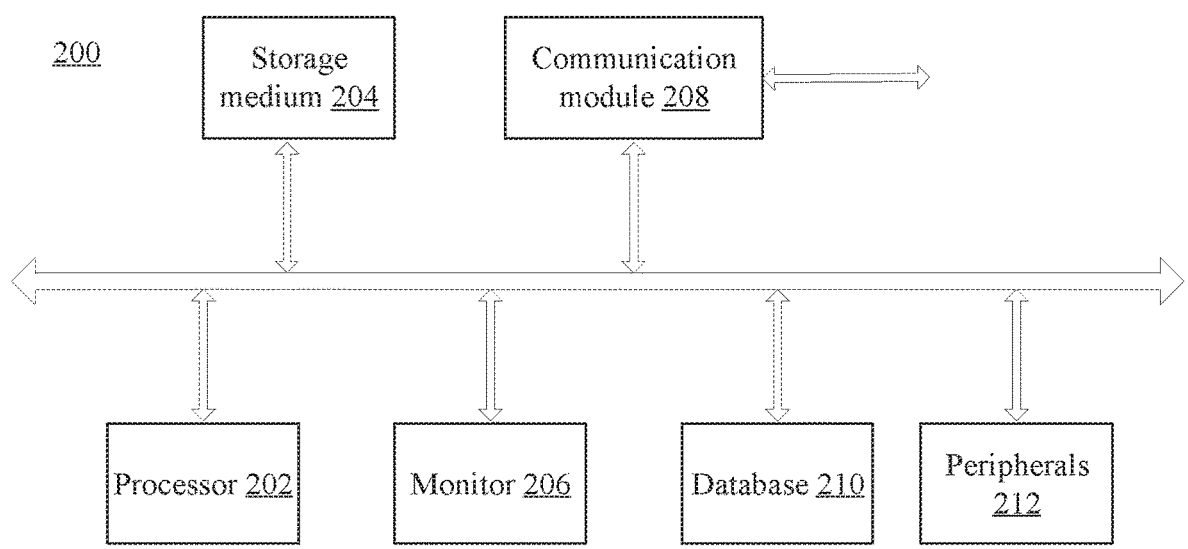
FIG. 2 illustrates an exemplary computing system consistent with the disclosed embodiments.

The scheduling server 120 and/or the big data computing platform 130 may be implemented by any appropriate computing system. FIG. 2 illustrates an exemplary computing system 200 consistent with the disclosed embodiments.

As shown in FIG. 2, computing system 200 may include a processor 202, a storage medium 204, a monitor 206, a communication module 208, a database 210, and peripherals 212. Certain devices may be omitted and other devices may be included.

Processor 202 may include any appropriate hardware processor or processors. Further, processor 202 can include multiple cores for multi-thread or parallel processing. Storage medium 204 may include memory modules, such as ROM, RAM, flash memory modules, and mass storages, such as CD-ROM and hard disk, etc. Storage medium 204 may store computer programs for implementing various processes, when the computer programs are executed by processor 202.

Further, peripherals 212 may include various sensors and other I/O devices, such as keyboard and mouse, and communication module 208 may include certain network interface devices for establishing connections through communication networks. Database 210 may include one or more databases for storing certain data and for performing certain operations on the stored data, such as database searching.

Returning to FIG. 1, in operation, the scheduling server 120 may obtain data from the database 116 and the big data computing platform 130 to perform load scheduling determination for the dispatching system 112, and may provide instructions to the dispatching system to start fabrication. The instructions may include the listing of product lots being fabricated, the order of the execution of the processes necessary to produce the product lots, and/or the manufacturing equipment (workstations) used to perform the processes.

Optionally, the status of each lot, the criticality factor of each piece of manufacturing equipment being employed in the process of each product lot, and the queue level of each piece of manufacturing equipment following the current piece of manufacturing equipment processing each of the product lots may also be obtained. Thus, a measure of the priority necessary to balance the loading may be created such that the product lot is processed at an expeditious time for on-time delivery.

Figure 3:
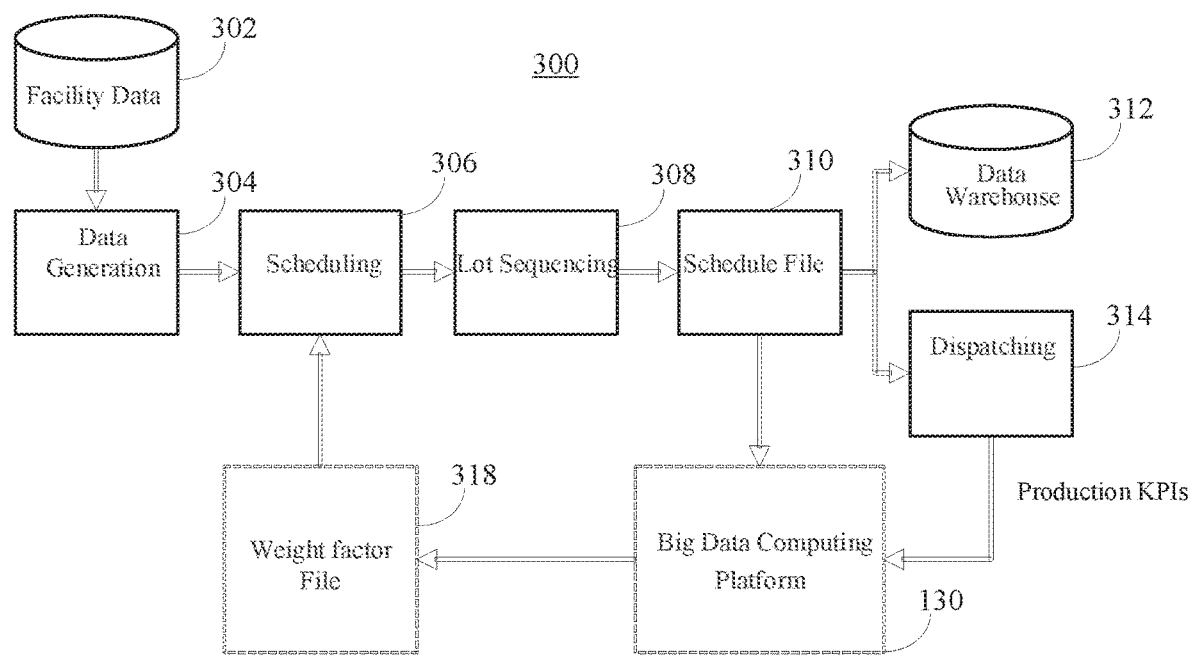
FIG. 3 illustrates a functional/structural block diagram of an exemplary load scheduling system consistent with the disclosed embodiments.

More specifically, the scheduling server 120 may implement a load scheduling system for providing enhanced load balancing/scheduling for the dispatching system 112. FIG. 3 illustrates a functional/structural block diagram of an exemplary load scheduling system 300 consistent with the disclosed embodiments.

As show in FIG. 3, the load scheduling system 300 includes facility data 302, a data generation module 304, a scheduling module 306, a lot sequencing module 308, a load schedule 310, a data warehouse 312, a dispatching module 314, the big data computing platform 130, and a weight-factor file generation module 318. Other components may also be included.

The facility data 302 may include any available data for the current fabrication, such as data of each available resource (e.g., workstation capacity, duration and order of stages and processes of the workstation), data of the product (e.g., worked required for the product, priority, duration and order of product processing steps), and data of the processes (e.g., standards, criteria, and performances). Other types of data may also be included.

Data generation module 304 may include certain data processing functions (e.g., a query executor or a dispatcher) to convert the facility data and other types of data into one or more specific data schema or data tables to be used by the scheduling module 306. The scheduling module 306 may include a load balancing model to generate a load schedule based on the data tables inputted by the data generation module 304. The load balancing model may include one or more predetermined load balancing algorithms to generate a load schedule profile. The load schedule profile may be information required to create a final load schedule 310 for the dispatcher, such as an initial load schedule, a load schedule to be verified, or any intermediate form of a final load schedule.

Further, the lot sequencing module 308 may include a simulation model for simulating an actual fabrication process based on the load schedule profile such that the load schedule profile can be verified. After the verification, the sequencing module 308 may generate an actual load schedule 310 for the manufacturing equipment (e.g., the workstations). The load schedule may be a text file, or may be a file in a predetermined format, such as a spreadsheet file.

The load schedule 310 may be entered into the data warehouse 312. The data warehouse 312 may refer to any database or computer server for hosting a large amount of data together with analysis tools to realize the data warehouse functionalities. The data warehouse may accumulate all accepted load schedule files as well as all corresponding data, such as the fabrication scenarios for individual load schedules and other production data. The fabrication scenarios may include information about the product lots, the workstations, the fabrication requirements, and production standards, etc.

The load schedule 310 may be provided to the dispatching module 314 (e.g., the dispatching system 120) for dispatching the wafer lots to the workstations to complete the fabrication processes.

The dispatching module 314 and/or the workstations can also provide fabrication data, such as production key performance indicators (KPIs) to the big data computing platform 130. The load schedule 310 may also be provided to the big data computing platform 130. The big data computing platform 130 may acquire all data needed to perform big data operations or machine learning operations, etc., and may provide results to the weight-factor file generation module 318.

The weight-factor file generation module 318 may include any appropriate analysis algorithm to determine various weight factors for the scheduling module 306 based on the results from the big data computing platform 130.

Figure 4:
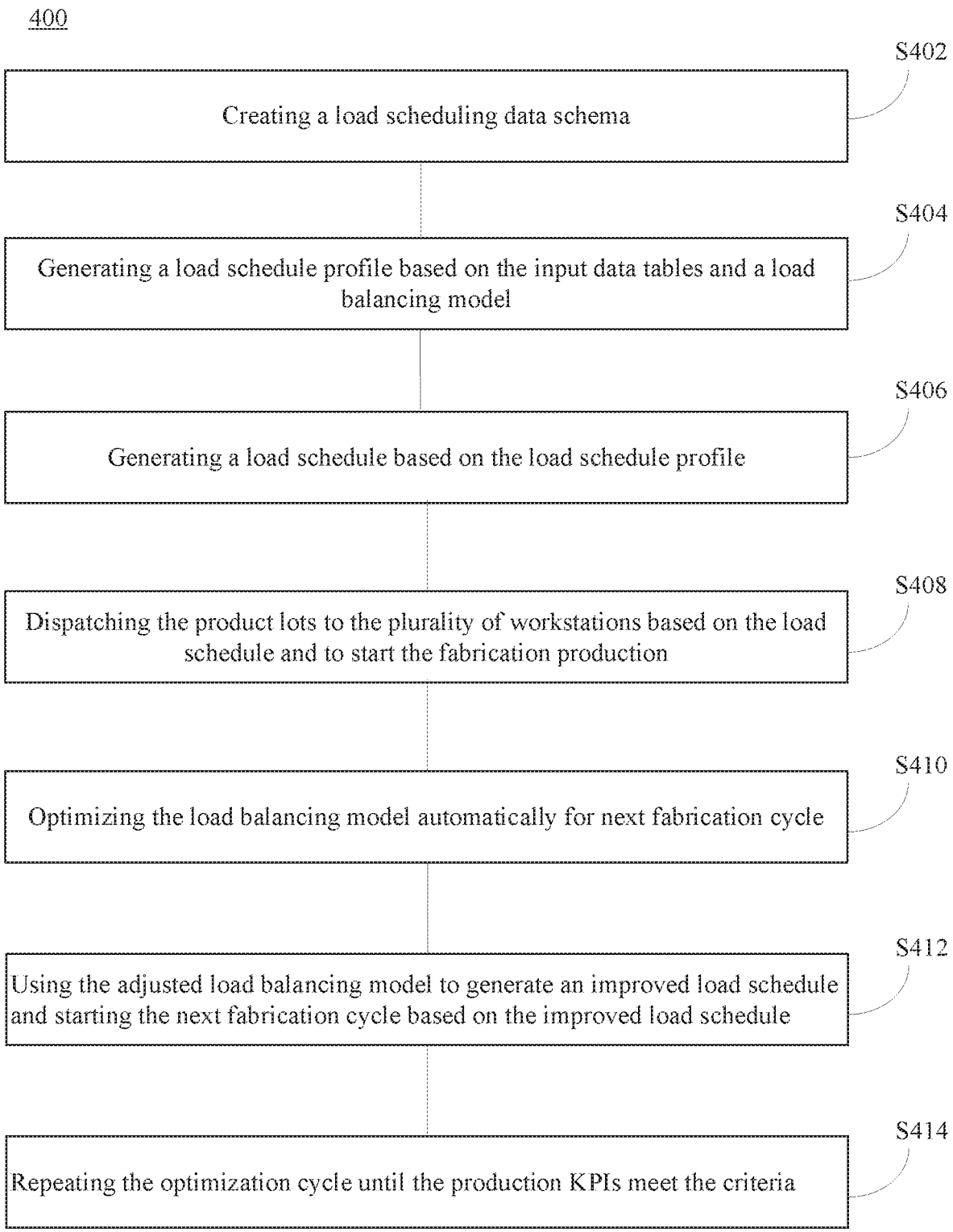
FIG. 4 illustrates an exemplary load scheduling process consistent with the disclosed embodiments.

In operation, the scheduling system 300 shown in FIG. 3 may perform a load scheduling process to create an optimized load schedule for completing the fabrication processes. FIG. 4 illustrates an exemplary load scheduling process 400 consistent with the disclosed embodiments.

As show in FIG. 4, at the beginning of the load scheduling process, a load scheduling data schema is created (S402). The load scheduling data schema may include one or more data tables generated based on facility data and other types of data, such as lot predictions. These data tables may also be called as input data tables. The facility data may be site-specific data, i.e., specific to a specific manufacturing site including the plurality of workstations. The lot predictions may be data templates and data model specific data, such as solutions schema data.

After the data tables are generated, a load schedule profile is generated based on the input data tables and a load-balancing model (S404). More specifically, the input data tables may be provided to the scheduling module 306, the scheduling module 306 may first generate a plurality of data tables to be used by the load-balancing model. For example, the scheduling module 306 may generate one or more of: an objective function weight table, a parameter table, a resource table, a task table, a task capacity table, a task setup table, and/or a time bucket table, etc.

The load-balancing model may use the data in the generated data tables and generate a load schedule profile. The load schedule profile may be in one or more output tables, such as a load balance table, and a lot assignment table, etc.

The load-balancing model may include any appropriate mathematical model configured to solve an assignment problem, i.e., finding an optimal assignment of tasks to resources based on related objective functions, such as balancing of work across the resources, with respect to the defined constraints (e.g., the limited capacity of the resources). In certain embodiments, the load-balancing model may be a mixed-integer programming (MIP) model. Although the load-balancing model may be configured to model the assignment of lot-steps to the workstations, other applications that requires assignment of tasks may also be applicable.

That is, the load-balancing model (or the scheduling model) may be an MIP model configured to find desired lot processing across scheduled tools (i.e., resources or workstations). The load-balancing model performs lot-to-tool assignments to meet specified scheduling objectives (such as minimizing tool setup changes, while meeting specified move targets). That is, the load-balancing model may have one or more objective functions used to describe the relative cost of metrics that are optimized when producing a load scheduling setup.

For example, the load-balancing model may include a load balance objective function. The objective function is to minimize absolution deviation for each resource (workstation):

$\min \Sigma_j |w_j - \text{AveWork}|$ where AveWork refers to the average work for all resources, which may be calculated by dividing the sum of all work by the number of resources s.t. $\Sigma_j x_{ij} = 1 \forall i$ All tasks i are assigned to some resource j $w_j = \Sigma_i c_{ij} x_{ij} \forall j$ Total work for each resource $w_j \leq C_j \forall_j$ Each resource has a limited capacity $x_{ij} \in 0,1$ Variable equals 1 if task 1 is assigned to resource j $w_j \geq 0$ The total work for each resource is non-negative $c_{ij}$ Is the work required if task i is assigned to resource j $C_j$ Is the capacity of resource j In certain embodiments, in addition to the Load Balance objective function above, the load-balancing model may include additional objective functions, which may be selected by a user and may include any one or more of: Full Bucket objective function, Constraints Move Target objective function, Process Early objective function, Setup Count objective function, Setup Time objective function, Per Station Early Processing objective function, Schedule Stability objective function, Reticle Count objective function, Non Preferred Resource objective function, Small Lots objective function, Distribute Tasks objective function, Seasoning objective function, Setup Change objective function, and Setup Limit objective function.

As used herein, a Load Balance objective function may refer to an objective functions that gives a cost to unbalanced loads, that is some resources starving for tasks while other resources are drowning in tasks. A Full Bucket objective function may refer to an objective functions that gives a cost to time buckets (main time interval is split into a few time buckets) that are not nearly full. The objective is to make sure that time buckets are all nearly full, which helps reducing wasting resource time. A Constraints Move Target objective function may refer to an objective functions that gives a cost to tasks that are not close to their move targets. A Process Early objective function may refer to an objective functions that gives a cost to tasks scheduled later and this way makes sure that all tasks are scheduled as early as possible. A Setup Time objective function may refer to an objective functions that gives a cost to the number of setups (setup times) used. A Per Station Early Processing objective function may refer to an objective functions that gives a cost to tasks labelled as "process early" by the user when they are scheduled later. A Schedule Stability objective function may refer to an objective functions that gives a cost to tasks that are scheduled in one optimization scenario but not in another. This reduces differences between scenarios and make the schedule more stable. A Reticle Count objective function may refer to an objective functions that gives a cost to reticle use. It makes sure load on reticles are balanced, prevents overusing some and starving others. A Non Preferred Resource objective function may refer to an objective functions that gives a cost to tasks that are not processed on a preferred resource. A Small Lots objective function may refer to an objective functions that gives a cost when two or more tasks defined as small lots are processed on the same resource in the same time bucket. A Distribute Tasks objective function may refer to an objective functions that gives a cost when two or more tasks that are assigned to a certain bucket are processed on the same resource. A Seasoning objective function may refer to an objective functions that gives a cost when two or more tasks requiring different PPIDs (process program ID) are assigned to the same resource. A Setup Change objective function may refer to an objective functions that gives a cost when two tasks requiring different setups are assigned to the same resource. A Setup Limit objective function may refer to an objective functions that gives a cost when too many setups of a certain type are assigned to a resource within a specified number of buckets beginning with the first bucket.

Other objective functions may also be included. The user may select a specific set of objective functions for a current fabrication cycle (i.e., from load scheduling to complete of the fabrication process).

Further, a load schedule may be generated based on the load schedule profile (e.g., the output data tables) (S406). For example, the lot sequencing module 308 may use an AutoSched AP/Fusion engine based on the output data tables from the load-balancing model to generate the load schedule for the plurality of workstations. In one embodiment, the load schedule may include a Lot Assignments table, which assigns specific lots to scheduled workstations for processing.

Further, the dispatcher (the dispatching system 112) may dispatch the product lots to the plurality of workstations based on the load schedule and to start the fabrication production (S408). That is, the dispatcher may use the Lot Assignments table to load the production lots to scheduled workstations and to complete the fabrication processes. The load schedule may also be stored in the data warehouse for later retrieval.

After the fabrication of the production lots is completed, the load-balancing model (or the scheduling model) may be optimized automatically for next fabrication cycle using a big-data architecture (S410). Specifically, after the current fabrication cycle is completed, production key performance indicators (KPIs) may be obtained, and it can be determined whether the KPIs are desired for the current fabrication, i.e., meeting a preset criteria for the production KPIs. If it is determined that the KPIs meet the criteria for the current fabrication, no optimization may be needed.

On the other hand, if it is determined that the KPIs do not meet the criteria for the current fabrication, the load-balancing model may be automatically optimized for next fabrication cycle. In certain embodiments, the criteria may include a set of target KPIs for the current fabrication (e.g. target cycle time or wafer moves). The determination may be performed based on a comparison between the current KPIs and target KPIs stored on the server. Optionally or additionally, the determination may also be performed based on a comparison between the current KPIs and the historical KPIs. The server may store various target KPIs, and each set of KPIs may correspond to a specific fabrication scenario, so that the current KPIs can be compared with the target KPIs under a same or similar fabrication scenarios.

After determining that the optimization is needed, the load-balancing model may be adjusted to perform the optimization. That is, the optimization may include adjusting parameters of the load-balancing model to improve the load schedule and the fabrication performance. As described above, the load-balancing model may include one or more objective functions. For each objective function, there may be one or more auxiliary variables (or weight factors) that can be adjusted. That is, after the current cycle of fabrication and before the next cycle of fabrication, the weight factors of certain or all objective functions of the load-balancing model may be adjusted automatically based on a big-data mechanism.

Figure 5:
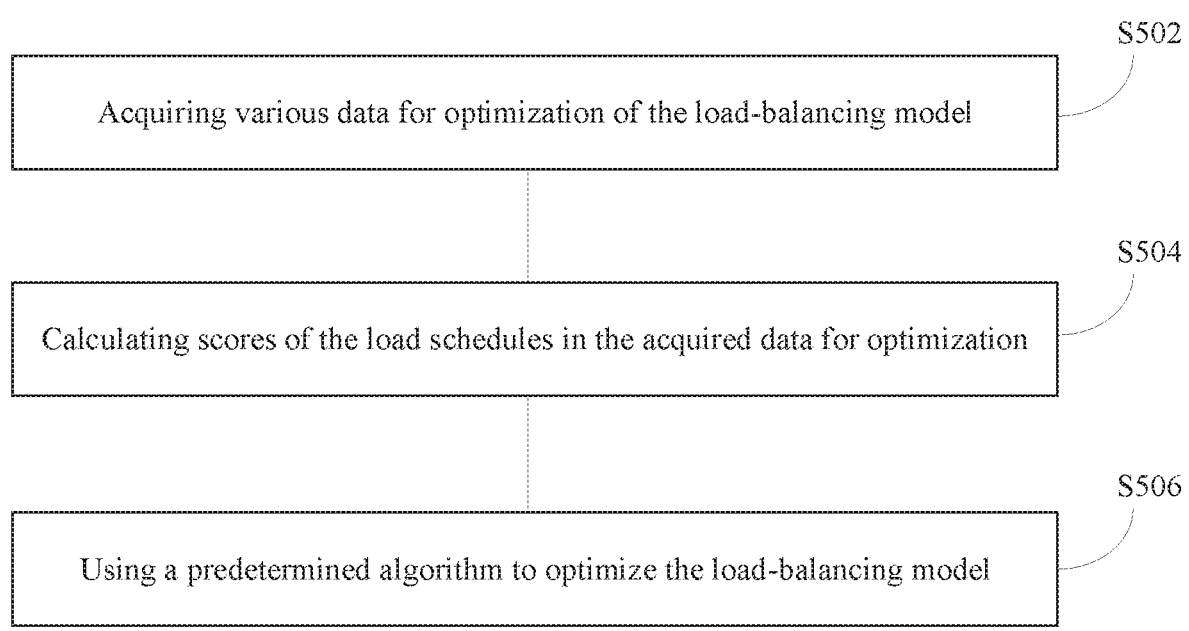
FIG. 5 illustrates an exemplary optimization process based on big-data to adjust the weight factors of the load-balancing model consistent with the disclosed embodiments.

FIG. 5 illustrates an exemplary optimization process based on big-data to adjust the weight factors of the load-balancing model consistent with the disclosed embodiments. As shown in FIG. 5, the big-data computing platform 130 may acquire various data for optimization of the load-balancing model (S502). A big-data architecture is used in the sense that the acquired data is broad and in a large amount, as the acquired data may be both historical and current, from current fabrication site and from other fabrication site and under various fabrication scenarios. Thus, such big-data architecture may produce more accurate results for adjusting the load-balancing model.

For example, the big-data computing platform 130 may acquire data about the load schedule, and the production KPIs, etc. The production KPIs may indicate the current status of the actual fabrication environment and production performance. For example, the KPIs may include one or more of: load balancing performance, bullet lot cycle time, hot lot cycle Time, actual cycle time, preferred tools, meet move targets, lot step due date, schedule stability, and reduce setup changes, etc.

As used herein, Load balancing performance may refer to a KPI that measures total work time or percentage for every resource. Hot lot cycle Time may refer to a KPI that measures cycle time for bullet lots, lots that receive preferential treatment in the fab and that are processed in front of the queue at process tools. Bullet lot cycle time may refer to a KPI that measures cycle time for bullet lots, lots that receive even more preferential treatment in the fab and that are processed in at the very front of the queue at process tools. Actual cycle time may refer to a KPI that measures cycle time, the number of days to complete a lot. Preferred tools may refer to a KPI that measures the scheduling on preferred tools, a way to indicate whether preferential assignment can be increased or should be decreased in the fab. Meet move targets may refer to a KPI that measures the daily move targets (production capacity) achieved in the fab production line. Lot step due date may refer to a KPI that measures whether processing of lots meet due date at every step in the fab. Schedule stability may refer to a KPI that measures the stability of the schedule produced by the optimizer in the production line. The differences between the theoretical schedule and in practice is monitored. Setup changes may refer to a KPI that measures the setup changes performed at process tools to apply the schedule.

Other performance indicators may also be included. Further, the big-data computing platform 130 may acquire historical data as well as the real-time date (i.e., data for the current fabrication cycle). For example, the big-data computing platform 130 may acquire load schedules used in the past and its corresponding KPIs under the same fabrication scenarios.

After acquiring the data for optimization, the big-data computing platform 130 may calculate scores of the load schedules in the acquired data for optimization (S504). Specifically, the load-balancing model may be optimized to maximize the score of the load schedule generated by the load-balancing model.

That is, for each load schedule under a corresponding fabrication scenario, a score can be calculated for each load schedule. The score may reflect performance of the fabrication based on the load schedule. For example, a high score may reflect desired performance of the current fabrication, i.e., desired KPIs. The score may be derived by any appropriate methods. In certain embodiments, the score of the load schedule may be calculated based on the applicable objective functions of the load schedule.

The score may be calculated based on the values of the objective functions and corresponding auxiliary variables or weight factors of the objective functions. Specifically, a value of each objective function of the load-balancing model may be determined and, as each objective function may have a weight factor, the score S of the load schedule determined by the load-balancing model may be calculated as:

$$S=\text{sum}(\text{Objective function weight factor}*\text{Objective function value})$$

Thus, as the weight factors of the objective functions of the load-balancing model can be tuned, the aim of the scheduling optimization is to find the best combination of weight factors to realize a highest score. The set of weight factors may be determined in advance based on a variable list or may be selected by the user.

Further, the big-data computing platform 130 may use a predetermined algorithm to optimize the load-balancing model (S506). The big-data computing platform 130 may apply a genetic algorithm, a Monte Carlo algorithm, a machine learning algorithm, or other similar optimization algorithms to perform the optimization. That is, the big-data computing platform 130 may use a genetic algorithm or a Monte Carlo algorithm to determine a best set of weight factors for the load-balancing model to achieve a highest score for the load schedule generated by the load-balancing model based on current constraints on the load-balancing model.

Figure 6:
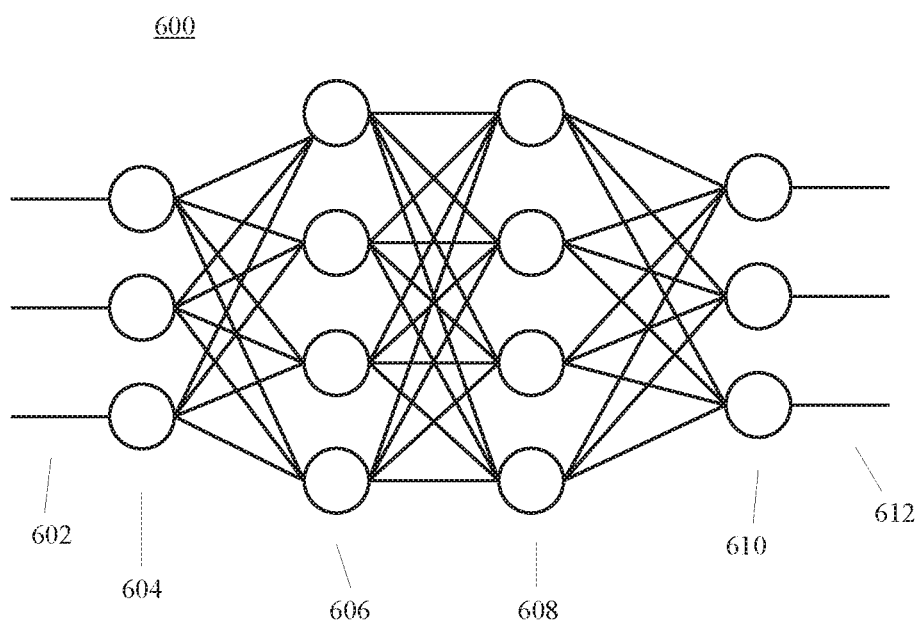
FIG. 6 illustrates an exemplary machine learning algorithm consistent with the disclosed embodiments.

In certain embodiments, the big-data computing platform 130 may use a machine learning algorithm to perform the optimization. FIG. 6 illustrates an exemplary machine learning algorithm (e.g., a deep learning neural-network model) 600 consistent with the disclosed embodiments.

As shown in FIG. 6, the deep-learning model 600 may include an input layer 604, middle layers 606 and 608 (hidden layers), and an output layer 610, etc. Input 602 are provided to the input layer 604, and output 612 are provided by the output layer 610. Each layer may include one or more neural-network node. The number of the neural-network layers are used for illustrative purposes, any number of the neural-network layers may be used.

The neural-network deep-learning model 600 may be used as an example for illustration, other architectures may also be used similarly. In certain embodiments, the big-data computing platform 130 may first train the deep-learning model 600 using relationships between the production KPIs and scores of load schedules.

Using the acquired historical data as training data, previous load schedules and corresponding values of a set of production KPIs (e.g., cycle time, wafer moves) may be obtained. The previous load schedules may be from various fabrication scenarios and workstations, or may be from a same fabrication scenario and same workstations but with different product lots. Further, as described above, the objective functions and objective function weight factors may be obtained or determined, and the score and/or weight factors of each load schedule may be calculated.

Further, the deep-learning model 600 may be trained based on the historical production KPIs and corresponding scores and/or values of weight factors. That is, the production KPIs are provided as input 602 of deep-learning model 600, and the scores and/or values of weight factors are provided as output 612 of deep-learning model 600. That is, in certain embodiment, the output of the deep-learning model 600 is the score, and the score may be used to derive corresponding values of the weight factors. In certain other embodiment, the values of the weight factors may be the output of the deep-learning model 600 directly, and score can be calculated based on the values of the weight factors. In certain other embodiments, both the scores and the values of the weight factors may be the output of the deep-learning model 600.

After the deep-learning model 600 is trained, based on the values of the current production KPIs, the target values of current set of production KPIs may be provided as input to the deep-learning model 600, and the score of the load schedule and the values of the weight factors of the load-balancing model may then be obtained based on the output of the deep-learning model 600. Optionally, to verify the result of the optimization performed by the deep-learning model 600, the score of the current load schedule may be calculated and may be compared with the obtained score from the deep-learning model 600. If it is determined that the obtained score is greater than the score of the current load schedule, the obtained values of the weight factors from the deep-learning model 600 may be used as the optimized values of the weight factors.

Returning to FIG. 4, after the load-balancing model is adjusted automatically for the next fabrication cycle (S410), the adjusted load-balancing model is used to generate an improved load schedule and the next fabrication cycle may be started based on the improved load schedule (S412). Further, the production KPIs of the next fabrication cycle is obtained and whether the production KPIs meet the preset criteria is determined. The above optimization cycle can then be repeated automatically until the production KPIs of the fabrication cycle meet the preset criteria (S414).

Accordingly, by using the disclosed methods and systems, the weight adjustment is not based on human trials and understanding of the objective functions, and manually adjusting the weight factors of the load-balancing model can be avoided. Further, any misunderstanding or miscommunication between human operators and any mistake may be the human operator in the operation of the manufacturing equipment can also be avoided. In addition, because a typical cycle for weight adjustment by human trials takes approximately a few days to a week, which is time consuming and affects the production line KPI (e.g. cycle time and wafer moves) during this adjustment period, manufacturing cost, efficiency, and effectiveness of the IC fabrication can be greatly improved.

Although the principles and implementations of the present disclosure are described by using specific embodiments in the specification, the foregoing descriptions of the embodiments are only intended to help understand the method and core idea of the method of the present disclosure. Meanwhile, a person of ordinary skill in the art may make modifications to the specific implementations and application range according to the idea of the present disclosure. In conclusion, the content of the specification should not be construed as a limitation to the present disclosure.

What is claimed is:

1. A semiconductor fabrication scheduling method, comprising:
creating a load scheduling data schema including facility data of product lots to be dispatched to a plurality of workstations;
generating a load schedule profile using a load-balancing model and based on the load scheduling data schema, wherein the load-balancing model includes one or more objective functions and there is at least one weight factor in an objective function;
generating a current load schedule based on the load schedule profile;
dispatching the product lots to the plurality of workstations using the current load schedule to complete fabrication of the product lots; and
after the product lots are dispatched and the fabrication of the product lots is further completed:
obtaining a set of current key performance indicators (KPIs) of the completed fabrication of the product lots;
using a big-data architecture to automatically adjust the weight factors of the objective functions of the load-balancing model based on the current KPIs; and
using the adjusted weight factors to generate a next load schedule for next cycle of fabrication.

2. The method according to claim 1, further comprising:
dispatching product lots of the next cycle of fabrication to the plurality of workstations using the next load schedule to complete the next cycle of fabrication.

3. The method according to claim 1, wherein the generating a current load schedule based on the load schedule profile includes:
simulating and verifying the load schedule profile to generate the current load schedule.

4. The method according to claim 1, wherein the automatically adjusting the weight factors of the objective functions of the load-balancing model based on the current KPIs using a big-data architecture to generate a next load schedule for next cycle of fabrication further includes:
obtaining target KPIs of the next cycle of fabrication;
determining whether the current KPIs are higher than the target KPIs; and
when it is determined that the current KPIs are higher than the target KPIs, using the current load schedule for the next cycle of fabrication without adjusting the weight factors of the objective functions of the load-balancing model.

5. The method according to claim 4, further including:
acquiring data for optimization including historical load schedules and corresponding KPIs;
calculating a score of each of the historical load schedules;

using a predetermined big-data algorithm to find a new set of values of the weight factors of the objective functions of the load-balancing model such that a desired score of a load schedule corresponding to the new set of values can be found; and automatically adjusting the weight factors of the objective functions of the load-balancing model to the new set of values.

6. The method according to claim 5, wherein:

the load-balancing model is a mixed-integer programming (MIP) model; and the predetermined big-data algorithm is a genetic algorithm or a Monte Carlo algorithm.

7. The method according to claim 5, wherein the using a predetermined big-data algorithm further includes:

training a neural-network deep-learning model using relationships between scores of the historical load schedules, together with values of the weight factors of the historical load schedules, and the KPIs corresponding to the historical load schedules; and after the neural-network deep-learning model is trained, with the target KPIs as input, using the neural-network deep-learning model to determine the new set of values of the weight factors of the objective functions of the load-balancing model.

8. The method according to claim 5, wherein the calculating a score of each of the historical load schedules further includes:

for each objective function in each historical load schedule with a corresponding weight factor, calculating a value of each objective function and multiplying the value by the corresponding weight factor to produce a production for each objective function; and summing the production of each objective function to generate the score.

9. The method according to claim 1, wherein the objective functions include at least a load balance objective function and a distribute tasks objective function.

10. A semiconductor fabrication scheduling system, comprising:

a plurality of workstations;

a server; and a dispatcher controlled by the server and dispatching product lots to be fabricated to the plurality of workstations, wherein the server is configured to perform:

creating a load scheduling data schema including facility data of the product lots;

generating a load schedule profile using a load-balancing model and based on the load scheduling data schema, wherein the load-balancing model includes one or more objective functions and there is at least one weight factor in an objective function;

generating a current load schedule based on the load schedule profile;

controlling the dispatcher to dispatch the product lots to the plurality of workstations using the current load schedule to complete fabrication of the product lots; and after the product lots are dispatched and the fabrication of the product lots is further completed:

obtaining a set of current key performance indicators (KPIs) of the completed fabrication of the product lots;

using a big-data architecture to automatically adjust the weight factors of the objective functions of the load-balancing model based on the current KPIs; and using the adjusted weight factors to generate a next load schedule for next cycle of fabrication.

11. The system according to claim 10, wherein the server is further configured to perform:

controlling the dispatcher to dispatch product lots of the next cycle of fabrication to the plurality of workstations using the next load schedule to complete the next cycle of fabrication.

12. The system according to claim 10, wherein the generating a current load schedule based on the load schedule profile includes:

simulating and verifying the load schedule profile to generate the current load schedule.

13. The system according to claim 10, wherein the automatically adjusting the weight factors of the objective functions of the load-balancing model based on the current KPIs using a big-data architecture to generate a next load schedule for next cycle of fabrication further includes:

obtaining target KPIs of the next cycle of fabrication;

determining whether the current KPIs are higher than the target KPIs; and when it is determined that the current KPIs are higher than the target KPIs, using the current load schedule for the next cycle of fabrication without adjusting the weight factors of the objective functions of the load-balancing model.

14. The system according to claim 13, wherein the automatically adjusting the weight factors of the objective functions further includes:

acquiring data for optimization including historical load schedules and corresponding KPIs;

calculating a score of each of the historical load schedules;

using a predetermined big-data algorithm to find a new set of values of the weight factors of the objective functions of the load-balancing model such that a desired score of a load schedule corresponding to the new set of values can be found; and automatically adjusting the weight factors of the objective functions of the load-balancing model to the new set of values.

15. The system according to claim 14, wherein:

the load-balancing model is a mixed-integer programming (MIP) model; and the predetermined big-data algorithm is a genetic algorithm or a Monte Carlo algorithm.

16. The system according to claim 14, wherein the using a predetermined big-data algorithm further includes:

training a neural-network deep-learning model using relationships between scores of the historical load schedules, together with values of the weight factors of the historical load schedules, and the KPIs corresponding to the historical load schedules; and after the neural-network deep-learning model is trained, with the target KPIs as input, using the neural-network deep-learning model to determine the new set of values of the weight factors of the objective functions of the load-balancing model.

17. The system according to claim 14, wherein the calculating a score of each of the historical load schedules further includes:

for each objective function in each historical load schedule with a corresponding weight factor, calculating a value of each objective function and multiplying the value by the corresponding weight factor to produce a production for each objective function; and summing the production of each objective function to generate the score.

18. A non-transitory computer-readable storage medium containing computer-executable instructions for, when executed by one or more processors, performing a semiconductor fabrication scheduling method comprising:
   creating a load scheduling data schema including facility data of product lots to be dispatched to a plurality of workstations;
   generating a load schedule profile using a load-balancing model and based on the load scheduling data schema, wherein the load-balancing model includes one or more objective functions and there is at least one weight factor in an objective function;
   generating a current load schedule based on the load schedule profile;
   controlling a dispatcher to dispatch the product lots to the plurality of workstations using the current load schedule to complete fabrication of the product lots; and
   after the product lots are dispatched and the fabrication of the product lots is further completed:
      obtaining a set of current key performance indicators (KPIs) of the completed fabrication of the product lots;
      using a big-data architecture to automatically adjust the weight factors of the objective functions of the load-balancing model based on the current KPIs; and
      using the adjusted weight factors to generate a next load schedule for next cycle of fabrication.

19. The non-transitory computer-readable storage medium according to claim 18, wherein the automatically adjusting the weight factors of the objective functions of the load-balancing model based on the current KPIs using a big-data architecture to generate a next load schedule for next cycle of fabrication further includes:
   obtaining target KPIs of the next cycle of fabrication;
   determining whether the current KPIs are higher than the target KPIs; and
   when it is determined that the current KPIs are higher than the target KPIs, using the current load schedule for the next cycle of fabrication without adjusting the weight factors of the objective functions of the load-balancing model.

20. The non-transitory computer-readable storage medium according to claim 19, the method further including:
   acquiring data for optimization including historical load schedules and corresponding KPIs;
   calculating a score of each of the historical load schedules;
   using a predetermined big-data algorithm to find a new set of values of the weight factors of the objective functions of the load-balancing model such that a desired score of a load schedule corresponding to the new set of values can be found; and
   automatically adjusting the weight factors of the objective functions of the load-balancing model to the new set of values.

* * * * *